United States Patent [19]

Gifford et al.

[11] Patent Number: 5,176,973
[45] Date of Patent: Jan. 5, 1993

[54] LOW OPTICAL DOT GAIN PRE-PRESS PROOFS WHEREIN THE FIRST DOWN ADHESIVE LAYER THICKNESS IS AT LEAST TWICE THAT OF ANY ADDITIONAL THIN ADHESIVE LAYER

[75] Inventors: Charles J. Gifford, Stillwater; Jack E. Cook, St. Paul; Bruce W. Weeks, Lake Elmo, all of Minn.; Julien M. Wajs, Domont, France

[73] Assignee: Minnesota Mining and Manufacturing Company, St. Paul, Minn.

[21] Appl. No.: 414,130

[22] Filed: Sep. 28, 1989

[51] Int. Cl.⁵ .................. G03C 5/00; G03C 7/00; G03F 7/11
[52] U.S. Cl. ........................ 430/15; 430/17; 430/18; 430/143; 430/162; 430/166; 430/257; 430/259; 430/293; 430/14
[58] Field of Search ........... 430/143, 162, 166, 293, 430/257, 259, 952, 176, 193, 220, 14, 15, 17, 18

[56] References Cited

U.S. PATENT DOCUMENTS

| | | |
|---|---|---|
| 2,591,309 | 4/1952 | Slifkin et al. ............... 430/176 |
| 2,603,564 | 7/1952 | Maxcy ........................ 430/177 |
| 3,136,637 | 6/1964 | Larson . | 
| 3,634,087 | 6/1969 | Houle et al. . |
| 3,671,236 | 6/1972 | Van Beusekom . |
| 4,260,673 | 4/1981 | Krech ......................... 430/143 |
| 4,284,703 | 8/1981 | Inoue et al. ................. 430/143 |
| 4,304,836 | 12/1981 | Cheema et al. ............ 430/252 |
| 4,482,625 | 11/1984 | Namiki et al. ............. 430/143 |
| 4,571,374 | 2/1986 | Uikesland .................. 430/143 |
| 4,634,652 | 1/1987 | Barton ........................ 430/156 |
| 4,634,658 | 1/1987 | Johnson et al. ............ 430/293 |
| 4,650,738 | 3/1987 | Platzer et al. .............. 430/143 |
| 4,656,114 | 4/1987 | Cederberg et al. ........ 430/160 |
| 4,666,817 | 5/1987 | Sachi .......................... 430/143 |
| 4,783,390 | 11/1988 | Mino et al. ................. 430/143 |
| 4,889,787 | 12/1989 | Musser ....................... 430/166 |
| 4,914,039 | 4/1990 | Wanat ........................ 430/258 |

FOREIGN PATENT DOCUMENTS

| | | |
|---|---|---|
| 0115899A3 | 8/1984 | European Pat. Off. . |
| 0305599A1 | 3/1989 | European Pat. Off. . |
| 3179356 | 7/1988 | Japan ........................ 430/143 |
| 6704053 | 9/1967 | Netherlands ............. 430/143 |

Primary Examiner—Charles L. Bowers, Jr.
Assistant Examiner—Christopher G. Young
Attorney, Agent, or Firm—Gary L. Griswold; Walter N. Kirn; Mark A. Litman

[57] ABSTRACT

An at least two-color low optical dot gain surlay pre-press color proof comprising a base having laminated thereto in the following order, a first adhesive layer, a first single-color image, and then at least one additional pair of thin adhesive layers and comprising a synthetic polymeric binder composition with a Tg of less than 105° and a thickness of 8–30 microns which thickness is at least twice that of any one of said additional thin adhesive layers.

21 Claims, No Drawings

LOW OPTICAL DOT GAIN PRE-PRESS PROOFS WHEREIN THE FIRST DOWN ADHESIVE LAYER THICKNESS IS AT LEAST TWICE THAT OF ANY ADDITIONAL THIN ADHESIVE LAYER

BACKGROUND OF THE INVENTION

1. Field of the Invention

The present invention relates to pre-press proofs and photosensitive media, particularly photosensitive media for use in generating color surprint pre-press proofs, particularly where low dot-gain is desired.

2. Background of the Art

In color reproduction, it is often necessary to verify the color accuracy of separation negatives and/or positives used in the printing process. This can be accomplished by producing a four or more color proof. There are presently two main types of color proofs used by printers: overlay and surprint proofs. An example of a negative-acting overlay proof is described in U.S. Pat. No. 3,136,637. That proofing method is based upon exposing and developing each presensitized color sheet separately and then superimposing the sheet to yield a multicolor composite. This method offers a very simple way of combining two or more colors in registration. However, it has several inherent disadvantages. The multiplicity of plastic sheets causes incident light to internally reflect. This reflection imparts a gloss, a color hue shift, and a distortion of the image which is not truly representative of printed copy. U.S. Pat. No. 4,634,652 and U.S. patent application Ser. No. 06/928,598 filed Nov. 14, 1986, describe improved overlay systems using more transparent substrates. However, an optical distortion of the image and subsequent color hue shift still remains due to the large spacing between the colored images.

A surprint proof is generated by successively superimposing different colored layers upon each other on a single sheet. The surprint color proofing materials are composed of two primary types: (1) photosensitive precolored sheets and (2) photosensitive colorless sheets whose latent image may be toned with pigments, inks or dyes (also referred to as a "post-colored" proofing material). Some examples of post-colored proofing materials may be found in U.S. Pat. No. 3,060,024; U.S. Pat. No. 3,634,087 and DE 3,336,431. In these systems, the image is weak and often requires a protective layer. The resultant color hue is also very user-dependent due to dependency upon color density control and lot-to-lot variation of the colorants.

Some examples of precolored proofing materials include constructions based upon both diazo and photopolymers as the photosensitive element. In U.S. Pat. No. 4,482,625 and U.S. Pat. No. 4,304,836, two different precolored photopolymer constructions are described which are imaged prior to lamination to the substrate or an intermediate sheet. A similar system is described in GB 2,144,867 A which utilizes precolored films sensitized with diazo-based polymers. These systems require the imaged films to be laminated in registry which is very dependent upon laminating speed, laminating temperature, and dimensional stability of the film and substrate. The accuracy of the registration is limited to small format proofs. This type of system also makes it very difficult to produce several proofs on a single large sheet (scatter proofing).

U.S. Pat. No. 3,671,236; U.S. Pat. No. 4,260,673; U.S. Pat. No. 4,650,738, U.S. Pat. No. 4,656,114; U.S. Pat. No. 4,659,642 and EPO 115,899 A3 describe diazo-sensitized precolored constructions which are laminated to the substrate prior to imaging. Each of these systems contain barrier and/or adhesive layers which remain in the final proof, lying between each image layer. The existence of these additional clear layers causes an optical enlargement of the halftone dots, better known as optical dot gain. The optical gain in these proofing systems gives a reasonable reproduction of the tonal curves for printing presses having dot gains in the 20–30% range. The different dot gains can be obtained by increasing the coating weights of the barrier and/or adhesive layers. U.S. Pat. No. 4,262,071 describes the incorporation of a spacer layer in order to increase the optical dot gain. All of these methods are effective for achieving the higher dot gains. However, it is very difficult to achieve the dot gains in the 8–20% range.

One approach to reducing the dot gain of a proof involves the use of a special base paper coated with a $TiO_2$ dispersion. EPO 305,599 describes a base paper of this type. However, the clear spacer layers (constituted by the adhesive of the medium) of the proofing films used with these papers must be as thin as possible. This is difficult to control.

EPO 243,932 describes an improved positive working color proofing film and process which claims to be able to reproduce dot gains in this lower range. This system is based upon toning a photopolymer image. Being a toning process, it suffers from a lack of reproducibility of the density and lot-to-lot color variance of the toners. The system described in EPO 243,932 patent application also incorporates optical brighteners which causes metamerism in the final proof.

U.S. patent application Ser. No. 07/185,971, filed on Apr. 25, 1988, in the name of A. K. Musser, describes a positive-acting presensitized colored sheet. To achieve low dot gain, a thin, 1.0 to $3.2 g/m^2$, adhesive layer is used. This construction provides optical dot gains in 40% tints of 14% to 22% on 3M Commercial Base Paper, 3M Company, St. Paul, Minn. and 13% to 20% on 3M Low Gain Commercial Base Paper, 3M Company, St. Paul, MN. To obtain optimum quality in the final proof made with this construction, high laminator roll temperatures and slow roll speeds are required. At less stringent conditions, the laminations of the second-down and subsequent color layers can show bubbles in the underlying tints, especially the 50% and higher tints. These air bubbles provide a more matte appearance in the shadow areas and cause an apparent shift in color hue in these areas. When higher lamination temperatures are used to reduce or eliminate the bubbles, the dimensions of the paper base are reduced with each lamination, giving rise to misregistration of the colored images.

SUMMARY OF THE INVENTION

The present invention relates to materials and processes for making pre-press color surprint proofs that provide low dot gains without the undesirable results of other constructions. In a multilayer laydown, surlayer proof of at least two different color proof images, a relatively thick adhesive layer is used in the first applied (first down) color proof, with all subsequent adhesive layers used to secure the subsequent color proofs being substantially thinner than the first color adhesive layer. This combination of different adhesive thicknesses both reduces bubble or microbubble formation during lamination and provides lower optical dot gain in the proof image. White particulate material such as $TiO_2$ can be added to a coating layer on the photosensitive medium, usually the clear, transparent coating of adhesive, on the outer surface of a surprint proofing film used in the first-down position of a series of colors to reduce dotgain by creating an apparently reduced optical thickness in the adhesive layers and proof. During the exposure to UV light in the imaging step, halation is reduced by the white particulate thereby providing better control for sharpening the image, and thus giving rise to less physical dot gain. An additive like $TiO_2$ also provides a white background for the proof and reduces the apparent optical dot gain.

Similar constructions without this white particulate additive require these clear, transparent adhesive coatings to be very thin to minimize the halation and optical dot gain. This invention eliminates this restriction. Thicker adhesives can be used for this first-down color to improve lamination quality, cause fewer bubbles, yet provide no increase in the dot gain. The requirement of using special $TiO_2$ coated papers on which to make low gain proofs is also eliminated by this invention.

Lower dot gain pre-press proofs, according to this invention, give a more faithful representation of the resultant color prints obtained on commercial printing presses.

DETAILED DESCRIPTION OF THE INVENTION

The present invention describes a new surprint proofing system based upon a color proofing sheet comprising at least two layers. One layer is a thermal adhesive layer, and the other layer is a colorant associated with a photosensitive component. Additional layers such as a strippable carrier layer with or without a release coating containing anti-halation components and/or release agents on one face which is in contact with the photosensitive layer and/or a barrier layer separating the photosensitive layer and the adhesive layer may be included in the construction.

The carrier sheet is provided with a release surface which may be either a smooth surface of the carrier itself or a surface coating thereon. The function of the release surface is to serve as a parting layer between the carrier sheet and the color layer. The preferred material for the carrier sheet in the present invention is a 2 mil (0.051 mm) polyester film provided with a release layer comprising a cellulose methyl ether or poly(vinyl alcohol) resin. The carrier sheet and/or release layer may contain anti-halation materials such as those described in EPO 165,030 A.

The adhesive layer must be a pressure sensitive or thermally laminable adhesive composition. Within this composition can be dispersed the white pigment of the most preferred practice of the present invention. The adhesive layer can then absorb radiation which is effective in exposing the photosensitive layer (i.e., actinic radiation). Where the actinic radiation is UV radiation, $TiO_2$ is a preferred pigment since it absorbs in the ultraviolet. Where the pigment does not absorb in the actinic radiation region, absorbers should be added to the adhesive layer which do absorb in that actinic region. Thus, $ZnO$, $BaSO_4$, $CaCO_3$ and other white particulates or pigments may be used as long as the composition of the adhesive layer is absorptive of actinic radiation. The pigment must add a useful level of white coloration to the adhesive layer so that light is scattered by this layer to assist in the control of optical dot gain. Silica alone does not provide a sufficient light scattering effect. Silica may be used in combination with other pigments (e.g., to provide antiblocking properties) or may be coated to provide the necessary white density in the adhesive layer.

Any thermally laminable adhesive or pressure sensitive adhesive composition could be used including thermal adhesives such as acrylates and methacrylates, polyesters, olefins, vinyl acetates, polyvinyl esters, vinyl chlorides, acrylonitriles and other known resins as thermally laminable adhesives or hot melt adhesives. Typical pressure sensitive adhesives include acrylates, polyurethanes, silicone resins, and the like. The Tg of the adhesive composition (e.g., the synthetic organic polymer, particulates, plasticizers, coating aids, colorants, etc.) should generally be less than 220° F. (105° C.) and preferably be less than 180° F. (85° C.) down to a preferred minimum of about 50°-80° F. (10°-25° C.). With thermal polymeric adhesive compositions in the lower range of Tg values, slip sheets, strippable carrier layers, and particulate antiblocking agents are useful. This is especially true with the first down thicker adhesive layer. Both the thick pigment containing thermal adhesive layer and the thin thermal adhesive layers used in successive proofing sheets should be flowable at the operating temperatures used during thermal lamination of the sheets or images. Normally the Tg of the thermal adhesive layer compositions should be at least 5° F. (3° C.) lower than the highest temperature used on a nip roller or platen in the apparatus. Preferably the Tg is at least 20° F. (12° C.) lower than that highest interface temperature. Pressure sensitive adhesives should also flow and conform to surfaces when subjected to laminating pressures. It is desirable that the thermal adhesive is not tacky at 180° C.

The Tg is merely a useful tool in generally describing the need for the polymer to thermally laminate to a receptor sheet at the operating temperature of commercially available prepress proofing laminating equipment. The adhesive, as a 10 micron thick coating on 0.05/mm thick polyethyleneterephthalate carrier film should be able to thermally seal to an identical adhesive on a carrier film at adhesive layer temperatures of less than 220° F. at 0.2-0.5 Newtons/mm$^2$ or less, which of course would require higher nip roll temperatures.

One other particularly useful addition to the adhesive layer is the presence of pigments to assist in precisely matching the color tone of the adhesive layer to particular receptor sheets. Specific paper bases may be specified as the receiving sheet for the adhered proof image, and the adhesive layer of the photosensitive medium may be tailored to precisely match the color tones of that receiving sheet. Optical brighteners and dyes may also be used for this color matching.

The adhesive layer must, of course, be an outermost layer when the proofing medium is transferred. A protective liner may be present before use. The adhesive layer may be the outermost layer, in contact with a barrier layer, colorant layer, or photosensitive layer in the proofing medium construction. The photosensitive layer may be either positive-acting or negative-acting, as known in the art.

The photosensitive imaging system can be either a positive-acting or a negative-acting system. A positive-acting system would include, but not be limited to, a base soluble organic polymeric resin binder having an o-quinone diazide or other positive-acting diazo oxide mixed with, dissolved in, or pendant to the binder. The layer also contains a colorant such as a pigment or dye. The diazo oxide must be soluble or otherwise present in amounts of at least 10% by weight in the organic polymeric resin binder. Preferred polymers of this layer are phenolic resins including both resols and novolaks. Base soluble acrylic resins and styrene maleic anhydride half ester copolymers are also useful. Other polymeric materials (such as polyvinyl butyral resin to disperse and hold the colorant) may be dissolved or mixed with the primary resin binder constituent. Epoxy resins may also be mixed or dissolved with the binder to adjust physical properties. Furthermore, crosslinked epoxy or polyurethane resins may be added as may polyisocyanates (or other epoxy resin crosslinking agents) and monoisicyanates to react with the phenolic resin or other polymer constituents.

An optional barrier layer (described in U.S. Pat. No. 4,260,673), whose function is to provide a clean background upon development of the color layer, may be included in the construction. The barrier layer may comprise a mixture of a phenol formaldehyde novolak resin, which is slightly penetrable by the aqueous alkaline developer, becoming soluble in said developer upon exposure to actinic light, and a diazo oxide. A preferred barrier layer consists of the reaction product of an alkali-solution of a phenol formaldehyde resin and 2-diazo-1-naphthol-5-sulfonyl chloride. The reaction product has been found to give a greater latitude in the choice of developers because of its resistance to attack.

An example of a negative-acting construction according to the present invention would typically comprise a carrier sheet provided with a release surface, which may either be a smooth surface of the carrier itself, or a surface coating thereon. Overlying the surface and in intimate clinging engagement therewith, but not adhesively bonded thereto, is a color coating comprising, for example, a pigmented organophilic water-insoluble solvent-softenable resinous polymer. Coated over and in contact with the color coating is a light-sensitive diazo resin layer. The color coating and light-sensitive layer are intimately associated and adherently bonded together (and in certain constructions can actually be combined into a single layer). The light-sensitive layer is soluble in a solution which can also soften and/or partially dissolve the color coating. The photosensitive elements also could be based on photopolymers rather than diazo chemistry.

Overlying the light-sensitive layer can be a continuous solvent-resistant resinous protective film or barrier layer. To the exposed surface of the barrier layer is applied a layer of thermally laminable adhesive. The outer surface of the adhesive can optionally be protected from contamination by dirt or grease by a protective release liner.

In applying that structure to a receptor substrate, such as white paper, the protective liner is first stripped from the structure, the bond to the paper and the adhesion between the several layers being greater than the non-adhesive clinging engagement between the carrier sheet and the color coating or the release layer. Following the removal of the carrier, the remaining structure, now bonded to the receptor substrate, is exposed to ultraviolet light through the appropriate color separation negative corresponding with the color of the particular coating. In the light-struck areas, the ultraviolet light passes through the color coating (which is transparent thereto) and exposes and insolubilizes the light-sensitive material. A firm bond is created between the light reacted material and the undercoatings and overlapping coatings. Adjacent unexposed areas remain light-sensitive.

The sheet is then processed with processing solvent selected with respect to the particular material of which the color coating layer is composed (and which contains or also acts as a solvent for the unexposed diazo), to develop the image. The color coating and the sensitizer in the non-light-struck areas is removed, leaving the color image anchored to the underlying barrier layer by the light-reacted diazo in exposed areas. During processing, the barrier layer serves as a barrier which protects the substrate (and adhesive) from solutions used during the processing.

The thick thermal adhesive layer of the present invention is coated at a coating weight of 10 to 30 g/m². A typical adhesive coating solution would include the following:

| | |
|---|---|
| Pliolite ® AC, Goodyear, styrene/acrylate copolymer | 171.0 g |
| Pliolite ® AC-80, Goodyear, styrene/acrylate copolymer | 57.0 g |
| TiPure ® 931, duPont, titanium dioxide | 240.0 g |
| Toluene | 1758.8 g |
| Santicizer ® 278, Monsanto a benzyl phthalate | 12.0 g |

EXAMPLE 1

The above described adhesive solution was coated on a positive-acting cyan layer at 9 g/m². This construction was used to produce a proof on 3M Low Gain base paper and on a resin-coated paper from Intermills Co., Belgium. The proofing film constructions were those described in U.S. patent application Ser. No. 185,971 (with the barrier layer) except for the above experimental adhesive which was used in place of the therein described adhesive only on the cyan medium which was the first-down color.

EXAMPLE 2

The adhesive solution of Example 1 was coated on a positive-acting cyan layer at 19 g/m² and a four-color proof was made as described in Example 1 on the Intermills base paper.

EXAMPLE 3

The adhesive solution of Example 1 was coated on the barrier layer of positive-acting cyan, per Example 1, except that the coating weight was 20 g/m². This film was used as the first-down color for a proof. The other three proofing films used to make a four-color proof on Intermills base paper were constructed according to U.S. Pat. No. 4,260,673.

Using the proofs from the first three examples and exposures that gave the indicated microline resolutions, the following dot gains were measured at 40% tint from an UGRA control element with a Gretag densitometer containing SPI Narrow Band Filters:

| Paper | Color | Microline Resolution | Dot Gain on 40% Tint |
|---|---|---|---|
| Example 1 | | | |
| 3M Low Gain | Cyan | 8 | 15% |
| | Magenta | 8 | 15% |

-continued

| Paper | Color | Microline Resolution | Dot Gain on 40% Tint |
|---|---|---|---|
| | Yellow | 8 | 14% |
| | Black | 12 | 12% |
| Intermills | Cyan | 15 | 12% |
| | Magenta | 10 | 13% |
| | Yellow | 12 | 16% |
| | Black | 12 | 15% |
| Example 2 | | | |
| Intermills | Cyan | 15 | 8% |
| | Magenta | 12 | 10% |
| | Yellow | 12 | 10% |
| | Black | 15 | 9% |
| Example 3 | | | |
| Intermills | Cyan | 12 | 18% |
| | Magenta | 15 | 16% |
| | Yellow | 15 | 17% |
| | Black | 15 | 16% |
| For comparison: | Data from U.S. patent application Ser. No. 185,971. | | |
| 3M Comm. | | | |
| Base Paper | Cyan | 15 | 18% |
| | Magenta | 15 | 19% |
| | Yellow | 4 | 21% |
| | Black | 10 | 20% |
| 3M Low Gain | | | |
| Base Paper | Cyan | 12 | 16% |
| | Magenta | 12 | 17% |
| | Yellow | 8 | 19% |
| | Black | 10 | 14% |

EXAMPLE 4

The $TiO_2$ amounts in the adhesive formulation used for the previous examples were adjusted to provide pigment to resin ratios of 0.2 to 1.0. Five formulations were made and coated onto positive-acting cyan layers. these cyans were then used in a four-color proof according to U.S. patent application Ser. No. 185,971. Dot gains measured with a Gretag densitometer are shown in the following table.

| Pigment/Resin Ratio | Adhesive Coating Weight (g/m$^2$) | TiO$_2$ Coating Weight (g/m$^2$) | Dot Gain On 40% Tint |
|---|---|---|---|
| 0.2 | 11.67 | 1.9 | 17% |
| 0.4 | 13.34 | 3.8 | 15% |
| 0.6 | 13.52 | 5.4 | 14% |
| 0.8 | 19.39 | 8.6 | 13% |
| 1.0 | 19.54 | 9.8 | 12% |

This shows that low-to-intermediate levels of dot gain can be effected by controlling the pigment-to-resin ratio in the adhesive layer.

EXAMPLE 5

A carrier sheet such as that described in EPO 165,030 A was coated with a 9.5 g/m$^2$ of the adhesive formulation used for Example 1. This $TiO_2$-filled transfer adhesive was thermally laminated to a resin coated paper from Intermills Co., Belgium, and the carrier sheet removed. A four-color proof was made on this paper base according to Example 1 using a cyan medium as the first-down layers. That cyan medium had the $TiO_2$-filled adhesive as per Example 1. The dot gains for each of the 40% tints were measured and the following results were obtained.

| Color | Dot Gain (%) |
|---|---|
| Cyan | 8 |
| Magenta | 12 |
| Yellow | 10 |
| Black | 9 |

EXAMPLE 6

Two single-sheet proofs were made from proofing films made according to the examples of U.S. Pat. No. 4,656,114. Both were on 3M Commercial Matchprint Base Paper. The adhesive for the first lamination on one proof, "A", contained $TiO_2$ like that used for Example 1. The other proof, "B", had all four-color proofing films as described in U.S. Pat. No. 4,656,114. Dot gains of 40% tints with these two constructions were compared.

| Color | "A" | "B" |
|---|---|---|
| Magenta | 24 | 25 |
| Cyan | 23 | 25 |
| Black | 24.5 | 26 |

The present invention may best be summarized by a description of both the inventive medium and the final proof. The medium comprises a proofing element comprising a photosensitive imaging layer (usually on a carrier sheet) associated with a color component and an adhesive layer on the other surface of said element (away from said carrier sheet, if one is present). The adhesive layer comprises a mixture of a thermal polymeric adhesive and a white particulate pigment. The weight ratio of particulate pigment to resin in the adhesive layer is between 0.25-2.5, with ratios of 0.50 to 2.0 preferred. The photosensitive imaging layer may be either negative-acting or positive-acting. The adhesive layer is generally 8-30 micrometers thick, and preferably is 9-20 microns thick. This is in comparison to adhesive layers in other laminable photoresist color prepress proofing elements which are 1-4 microns, and usually 1.5 to 3.5 micrometers thick.

When the final multicolor proofing image is formed, there will be a base (coated or not), a first adhesive layer and color image, and then additional adhesive layers with their respective color images. The first adhesive layer in the practice of the present invention will be at least two times thicker than any of the additional adhesive layers, and only the first adhesive layer will have white particulate present in the adhesive in an amount of at least 20% by weight of said adhesive layer. The final proof will therefore be distinctly recognizable as the product of the practice of the present invention.

We claim:

1. An at least two-color low optical dot gain surlay pre-press color proof comprising a base having laminated thereto in the following order, a first adhesive layer, a first single-color image, and then at least on additional pair of thin adhesive layers and different single-color images, said first adhesive layer comprising a synthetic polymeric binder composition with a Tg of less than 105° C. and a thickness of 8-30 microns which thickness is at least twice that of any one of said additional thin adhesive layers.

2. A photosensitive color pre-press proofing element comprising at least two layers:

a) a photosensitive layer and an associated colorant, and
b) on one side of said element, a thermal adhesive layer or pressure-sensitive adhesive layer comprising a polymer composition and a white particulate pigment present in the adhesive layer in an amount of at least 20% by weight of the total weight of said adhesive layer, said adhesive layer absorbing radiation to which said photosensitive layer is photosensitive.

3. The element of claim 2 wherein the side of the element away from said adhesive layer is strippably adhered to a carrier sheet.

4. The element of claim 3 wherein said pigment comprises $TiO_2$.

5. The element of claim 4 wherein the ratio of pigment-to-polymer in said adhesive layer is between 0.25 and 2.5.

6. The element of claim 5 wherein said adhesive layer has a thickness of from 8 to 30 micrometers.

7. The element of claim 4 wherein said adhesive layer is a thermal adhesive layer which has a thickness of from 8 to 30 micrometers.

8. The element of claim 2 wherein said pigment comprises $TiO_2$.

9. The element of claim 8 wherein said adhesive layer is a thermal adhesive layer and the ratio of pigment-to-polymer in said thermal adhesive layer is between 0.25 and 2.5.

10. The element of claim 9 wherein said thermal adhesive layer has a thickness of from 8 to 30 micrometers.

11. The element of claim 9 wherein said thermal adhesive layer has a thickness of from 9 to 20 micrometers.

12. The element of claim 8 wherein said adhesive layer has a thickness of from 8 to 30 micrometers.

13. The element of claim 8 wherein a colorant is present in said adhesive layer in addition to said white pigment.

14. An at least two-color surlay pre-press color proof comprising a base having adhered thereto in the following order, a first adhesive layer, a first single-color image, and then at least one pair of adhesive layer and different single color image, said first adhesive layer comprising a polymeric binder and a white particulate pigment, said pigment being present in the adhesive layer in an amount of at lest 20% by weight of the total weight of said adhesive layer, the first adhesive layer being at least twice as thick as any of the other adhesive layers in any of said at least one pair of adhesive layer and different single color image.

15. The proof of claim 14 wherein said first adhesive layer comprises said white pigment in a weight ratio of between 0.25 and 2.5 to said polymeric binder.

16. The proof of claim 15 wherein said white particulate pigment comprises titanium dioxide.

17. The proof of claim 14 wherein the thickness of said first adhesive layer is between 8 and 30 micrometers.

18. The proof of claim 17 wherein said first adhesive layer comprises said white pigment in a weight ration of between 0.25 and 2.5 to said polymeric binder.

19. The proof of claim 18 wherein said white particulate pigment comprises titanium dioxide.

20. The proof of claim 17 wherein said white particulate pigment comprises titanium dioxide.

21. The proof of claim 14 wherein said white particulate pigment comprises titanium dioxide.

* * * * *

UNITED STATES PATENT AND TRADEMARK OFFICE
CERTIFICATE OF CORRECTION

PATENT NO. : 5,176,973
DATED : January 5, 1993
INVENTOR(S) : Gifford et al.

It is certified that error appears in the above-indentified patent and that said Letters Patent is hereby corrected as shown below:

```
Column 4, line 21, delete "sheets,," and
insert --sheets,--.
Column 8, line 60, delete "on" and
insert --one--.
Column 10, line 13, delete "lest" and
insert --least--.
Column 10, line 27, delete "ration" and
insert --ratio--.
```

Signed and Sealed this

Twentieth Day of September, 1994

*Attest:*

BRUCE LEHMAN

*Attesting Officer*     *Commissioner of Patents and Trademarks*

REEXAMINATION CERTIFICATE (3962nd)

United States Patent [19]
Gifford et al.

[11] B1 5,176,973
[45] Certificate Issued Dec. 28, 1999

[54] LOW OPTICAL DOT GAIN PRE-PRESS PROOFS WHEREIN THE FIRST DOWN ADHESIVE LAYER THICKNESS IS AT LEAST TWICE THAT OF ANY ADDITIONAL THIN ADHESIVE LAYER

[75] Inventors: Charles J. Gifford, Stillwater; Jack E. Cook, St. Paul; Bruce W. Weeks, Lake Elmo, all of Minn.; Julien M. Wajs, Domont, France

[73] Assignee: Imation Corp., St. Paul, Minn.

Reexamination Request:
No. 90/005,128, Oct. 30, 1998

Reexamination Certificate for:
Patent No.: 5,176,973
Issued: Jan. 5, 1993
Appl. No.: 07/414,130
Filed: Sep. 28, 1989

Certificate of Correction issued Sep. 20, 1994.

[51] Int. Cl.$^6$ .............................. G03C 5/00; G03C 7/00; G03F 7/11
[52] U.S. Cl. .............................. 430/15; 430/17; 430/18; 430/143; 430/162; 430/166; 430/257; 430/259; 430/293; 430/14
[58] Field of Search .................................. 430/14, 15, 17, 430/18, 143, 162, 166, 176, 193, 257, 259, 270.1, 293, 952

[56] References Cited

U.S. PATENT DOCUMENTS

| 4,262,071 | 4/1981 | Larson | 430/11 |
|---|---|---|---|
| 4,734,356 | 3/1988 | Bauer et al. | 430/293 |

FOREIGN PATENT DOCUMENTS

| 0286919 | 10/1988 | European Pat. Off. . |
|---|---|---|
| 0365358 | 4/1990 | European Pat. Off. . |
| 2020838 | 11/1979 | United Kingdom . |

*Primary Examiner*—Christopher G. Young

[57] ABSTRACT

An at least two-color low optical dot gain surlay pre-press color proof comprising a base having laminated thereto in the following order, a first adhesive layer, a first single-color image, and then at least one additional pair of thin adhesive layers and comprising a synthetic polymeric binder composition with a Tg of less than 105° and a thickness of 8–30 microns which thickness is at least twice that of any one of said additional thin adhesive layers.

REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1–21 is confirmed.

* * * * *